United States Patent
Moroo

(10) Patent No.: US 10,423,902 B2
(45) Date of Patent: Sep. 24, 2019

(54) PARALLEL PROCESSING APPARATUS AND METHOD OF ESTIMATING POWER CONSUMPTION OF JOBS

(71) Applicant: FUJITSU LIMITED, Kawasaki-shi, Kanagawa (JP)

(72) Inventor: Jun Moroo, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 57 days.

(21) Appl. No.: 15/697,484

(22) Filed: Sep. 7, 2017

(65) Prior Publication Data
US 2018/0144272 A1    May 24, 2018

(30) Foreign Application Priority Data
Nov. 22, 2016 (JP) .................................. 2016-226838

(51) Int. Cl.
*G01R 21/00* (2006.01)
*G06Q 10/06* (2012.01)
(Continued)

(52) U.S. Cl.
CPC .............. *G06Q 10/06* (2013.01); *G01R 21/00* (2013.01); *G06F 1/3203* (2013.01);
(Continued)

(58) Field of Classification Search
None
See application file for complete search history.

(56) References Cited

U.S. PATENT DOCUMENTS

| 2011/0271283 A1* | 11/2011 | Bell, Jr. ............... | G06F 9/5094 718/102 |
| 2012/0180055 A1* | 7/2012 | Brech ................... | G06F 9/4893 718/102 |

(Continued)

FOREIGN PATENT DOCUMENTS

| JP | 2016-042284 | 3/2016 |
| WO | 2013-128555 | 9/2013 |

OTHER PUBLICATIONS

Keiji Yamamoto et al., "Predicting Power Consumption of Jobs Using Execution Records in the Past", Information Processing Society of Japan, SIG Technical Report, vol. 2015-HPC-151 No. 2, Sep. 23, 2015 (8 pages).

(Continued)

*Primary Examiner* — Tanh Q Nguyen
(74) *Attorney, Agent, or Firm* — Fujitsu Patent Center

(57) ABSTRACT

A processor extracts a first file name from a file path indicating a storage location of a first file used when launching a first job. The processor calculates, for each of a plurality of second jobs that have been executed, a similarity based on a comparison between partial character strings included in the first file name and partial character strings included in a second file name corresponding to a second file that was used when launching the second job. The processor acquires, from history information indicating an actual power consumption of each of the plurality of second jobs and in accordance with the calculated similarity, the actual power consumption of at least one second job and estimates power consumption of the first job based on the acquired actual power consumption.

5 Claims, 9 Drawing Sheets

(51) Int. Cl.
*G06F 1/3203* (2019.01)
*G06F 9/48* (2006.01)
*G06F 9/50* (2006.01)
G06F 1/32 (2019.01)
G06F 1/329 (2019.01)

(52) U.S. Cl.
CPC ............ *G06F 9/4893* (2013.01); *G06F 9/505* (2013.01); *G06F 1/329* (2013.01); *G06F 2209/5019* (2013.01)

(56) References Cited

U.S. PATENT DOCUMENTS

| | | |
|---|---|---|
| 2013/0226639 A1 | 8/2013 | Yokoyama et al. |
| 2016/0048413 A1 | 2/2016 | Matsuyama et al. |
| 2016/0357232 A1* | 12/2016 | Kalyanasundaram .. G06F 1/206 |
| 2018/0144272 A1* | 5/2018 | Moroo .................. G06F 1/3203 |

OTHER PUBLICATIONS

Warren Smith et al., "Predicting Application Run Times Using Historical Information", Proceedings of IPPS/SPDP '98 Workshop on Job Scheduling Strategies for Parallel Processing (JSSPP), Mar. 30, 1998 (16 pages).

\* cited by examiner

POWER CONSUMPTION
HISTORY TABLE
                                                                    ┌─ 121

| FILE NAME | TRIGRAMS | POWER CONSUMPTION |
|---|---|---|
| abcabc.sh | '__a':1 '_ab':1 '.sh':1 'abc':2 'bc.':1 'bca':1 'c.s':1 'cab':1 'h__':1 'sh_':1 | 120W |
| abcnnn.sh | '__a':1 '_ab':1 '.sh':1 'abc':1 'bcn':1 'cnn':1 'h__':1 'n.s':1 'nn.':1 'nnn':1 'sh_':1 | 121W |
| NB-p=20,q=20.sh | '__N':1 '_NB':1 ',q=':1 '-p=':1 '.sh':1 '0,q':1 '0.s':1 '20,':1 '20.':1 '=20':2 'B-p':1 'NB-':1 'h__':1 'p=2':1 'q=2':1 'sh_':1 | 230W |
| NB-p=25,q=20.sh | '__N':1 '_NB':1 ',q=':1 '-p=':1 '.sh':1 '0.s':1 '20.':1 '25,':1 '5,q':1 '=20':1 '=25':1 'B-p':1 'NB-':1 'h__':1 'p=2':1 'q=2':1 'sh_':1 | 210W |

FIG. 6

PARALLEL PROCESSING APPARATUS AND METHOD OF ESTIMATING POWER CONSUMPTION OF JOBS

CROSS-REFERENCE TO RELATED APPLICATION

This application is based upon and claims the benefit of priority of the prior Japanese Patent Application No. 2016-226838, filed on Nov. 22, 2016, the entire contents of which are incorporated herein by reference.

FIELD

The embodiments discussed herein are related to a parallel processing apparatus and a method of estimating power consumption of jobs.

BACKGROUND

Parallel processing systems, which have a plurality of computers (sometimes referred to as "computing nodes") connected to a network and perform large-scale computation through parallel operation of the plurality of computing nodes, are already in use. Jobs are inputted into a parallel processing system from one or more users. When a job is inputted, launch information, such as the file name of a user program to be launched, may be designated, as well as execution conditions, such as the number of used nodes. The parallel processing system performs so-called "job scheduling" that assigns one or more computing nodes to each of the jobs that have been inputted with consideration to the designated execution conditions.

Note that a management server that assigns tasks to a plurality of operators has also been proposed. When a new task has occurred, the proposed management server searches for existing tasks that are similar to the new task and preferentially assigns the new task to an operator or operators assigned similar existing tasks. To calculate similarity, the management server acquires character information relating to the existing tasks and character information relating to the new task. The management server performs morphological analysis to extract words from the character information and calculates similarity based on the proportion of words that commonly appear in both an existing task and the new task. Alternatively, the management server calculates similarity according to a method such as n-gram or edit distance.

A parallel processing system that estimates resource usage of a new job has also been proposed. The proposed parallel processing system stores an execution history including job attributes and a resource usage state of jobs that have been executed. The parallel processing system searches for executed jobs whose job attributes are similar to a new job and estimates the resource usage of the new job based on the resource usage state of a similar executed job or jobs. The job attributes include a program name.

See, for example, the following documents:
International Publication Pamphlet No. WO2013/128555; and
Japanese Laid-open Patent Publication No. 2016-42284.

However, the higher the usage rate of the computing nodes (i.e., the higher the proportion of computing nodes that have been assigned a job and therefore are not free), the higher the power consumption of the parallel processing system. On the other hand, for economic and equipment-related reasons, it is not realistic for a parallel processing system to make unlimited use of power. For this reason, when scheduling jobs, it is preferable for a parallel processing system to adjust the combination of jobs to be simultaneously executed so that the total power consumption does not exceed an upper limit. To do so, the parallel processing system estimates the power consumption of jobs awaiting execution.

However, in addition to the number of used nodes, the power consumption of a job also depends on the characteristics of the user program to be launched. As one example, the power consumption of a job may depend on the memory access frequency, the disk access frequency, and/or the communication frequency, and may even depend on the pipeline processing efficiency of the user program and the extent to which SIMD (Single Instruction Multiple Data) is used. The jobs inputted into a parallel processing system are not limited to repeatedly designating the same program names, so that jobs may be inputted with program names that gradually change. This results in the problem of how to estimate the power consumption of jobs awaiting execution.

SUMMARY

According to one aspect, there is provided a non-transitory computer-readable storage medium storing a computer program, the computer program that causes a computer to perform a procedure including: extracting a first file name, which is part of a file path indicating a storage location of a first file used when launching a first job, from the file path; calculating, for each of a plurality of second jobs that have been executed, similarity based on a comparison between partial character strings included in the first file name and partial character strings included in a second file name corresponding to a second file used when launching the each second job; and acquiring, from history information indicating an actual power consumption of each second job in the plurality of second jobs and in accordance with the calculated similarity, the actual power consumption of at least one second job and estimating power consumption of the first job based on the acquired actual power consumption.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 6 depicts an example of a power consumption history table;

DESCRIPTION OF EMBODIMENTS

Figure 1:
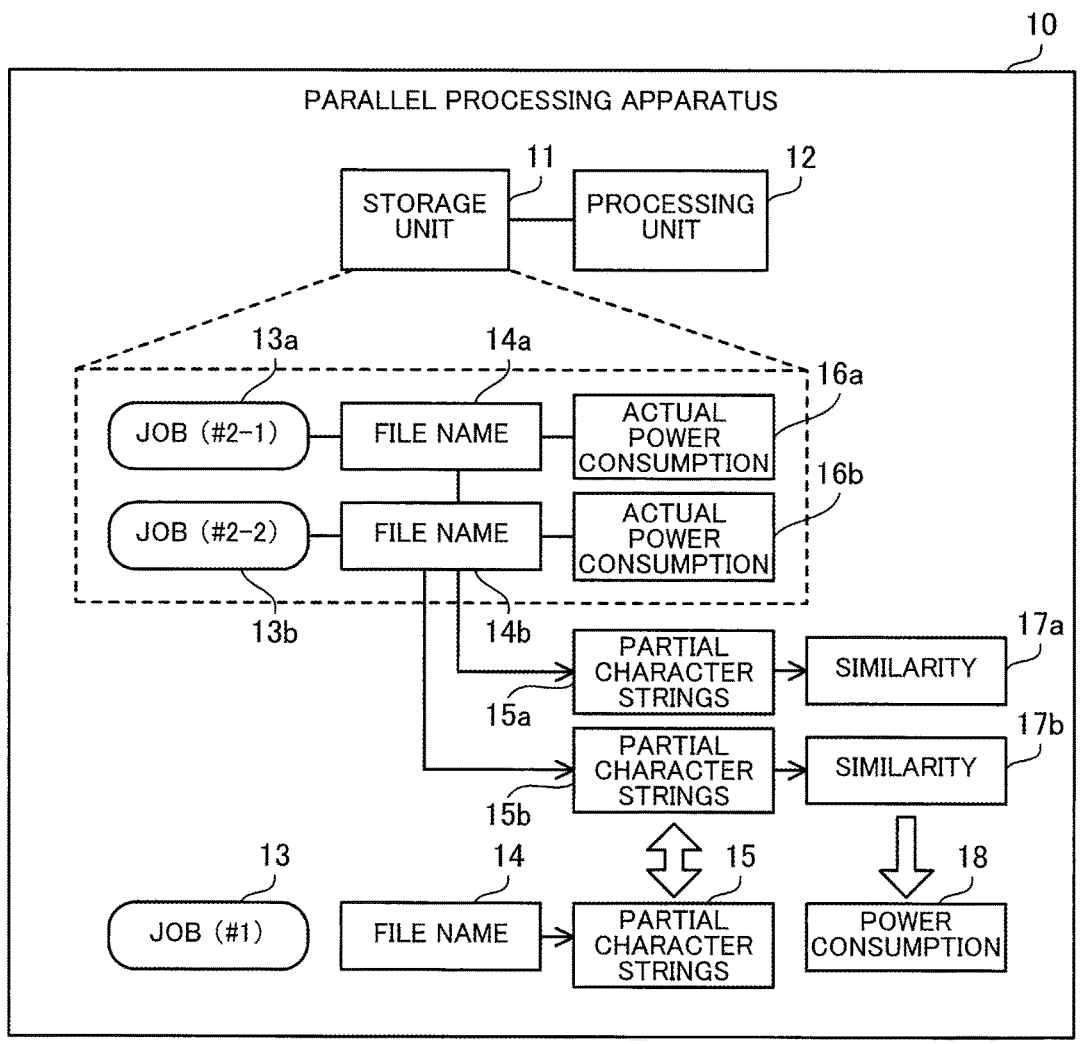
FIG. 1 depicts one example of a parallel processing system according to a first embodiment.

Several embodiments will be described below with reference to the accompanying drawings, wherein like reference numerals refer to like elements throughout.

First Embodiment

A first embodiment will now be described.

FIG. 1 depicts one example of a parallel processing system according to the first embodiment.

The parallel processing system according to the first embodiment includes a parallel processing apparatus 10. The parallel processing apparatus 10 controls parallel distributed processing that uses a plurality of computing nodes. The computing nodes may be included in the parallel processing apparatus 10, and/or the computing nodes may exist outside the parallel processing apparatus 10.

The parallel processing apparatus 10 estimates the power consumption of a job that performs information processing using one or more of the computing nodes before the job is executed. The estimated power consumption may be used during job scheduling. As one example, the parallel processing apparatus 10 receives execution requests for jobs and assigns one or more computing nodes to each received job with consideration to the estimated power consumption. At this time, it is preferable for the parallel processing apparatus 10 to schedule jobs so that the total power consumption of the parallel processing system in each time zone does not exceed a predetermined upper limit.

In this example, the power consumption of each job depends on the used number of nodes and the characteristics of the user program. The characteristics of the user program include the memory access frequency, the disk access frequency, the communication frequency, the pipeline processing efficiency, and the extent to which SIMD (Single Instruction Multiple Data) is used. For this reason, the parallel processing apparatus 10 estimates the power consumption of each job as described below.

The parallel processing apparatus 10 includes a storage unit 11 and a processing unit 12. As examples, the storage unit 11 is a volatile storage apparatus, such as RAM (Random Access Memory), or a nonvolatile storage apparatus, such as an HDD (Hard Disk Drive) or a flash memory. As one example, the processing unit 12 is a processor such as a CPU (Central Processing Unit) or a DSP (Digital Signal Processor). However, the processing unit 12 may include application-specific electronic circuitry, such as an ASIC (Application Specific Integrated Circuit) or an FPGA (Field Programmable Gate Array). The processor executes programs stored in a memory, such as RAM. As one example, the processor executes a job power consumption estimating program. In this specification, a group including a plurality of processors is referred to as a "multi-processor" or simply as a "processor".

The storage unit 11 stores history information relating to executed jobs 13a and 13b. The history information includes file names 14a and 14b or partial character strings 15a and 15b that have been extracted from the file names 14a and 14b, and actual power consumption 16a and 16b. The file name 14a, the partial character strings 15a, and the actual power consumption 16a correspond to the job 13a and the file name 14b, the partial character strings 15b, and the actual power consumption 16b correspond to the job 13b.

The file name 14a is part of a file path that indicates a storage location of a file used when the job 13a is launched. The file name 14b is part of a file path that indicates a storage location of a file used when the job 13b is launched. As one example, the file is a script file in which execution conditions, an execution procedure, and the like are written. However, the file may be a program file in which a user program is written. The file names 14a and 14b may be the names of the files themselves, such as "aaa.sh", without including a directory name. It is also possible however for the file names 14a and 14b to be a combination, such as "user/aaa.sh", of the name of a file and the directory name of a directory immediately above the file.

The partial character strings 15a are parts of a character string indicating the file name 14a. The partial character strings 15b are parts of a character string indicating the file name 14b. As one example, the partial character strings 15a and 15b are "n-grams" indicating n consecutive characters (where n is an integer of two or higher). Normally, a plurality of partial character strings are extracted from one file name. In this case, respective sets of partial character strings are associated with the jobs 13a and 13b.

As one example, the actual power consumption 16a is the power consumption of the computing nodes assigned to the job 13a that was measured during execution of the job 13a. Similarly, as one example, the actual power consumption 16b is the power consumption of the computing nodes assigned to the job 13b that was measured during execution of the job 13b. The actual power consumption may include the power consumption of a processor and the power consumption of a memory. The actual power consumption 16a and 16b may be the mean power consumption during a job execution period or may be the power consumption at a specified time during a job execution period. When two or more computing nodes are used, the actual power consumption 16a and 16b may be the mean power consumption per computing node. When jobs are executed a plurality of times based on files with the same file names, the actual power consumption 16a and 16b may be the mean power consumption across a plurality of executions.

The processing unit 12 detects a job 13 that is yet to be executed. The processing unit 12 then extracts a file name 14, which is part of a file path indicating the storage location of a file used when launching the job 13, from the file path. The file may be a script file or may be a program file. The file name 14 may be the name of the file itself or may be a combination of the name of the file and the name of the directory immediately above the file. The processing unit 12 extracts partial character strings 15 that are parts of the character string indicating the file name 14. As one example, the partial character strings 15 are n-grams. A set of partial character strings may be extracted from the file name 14.

For the job 13a indicated by the history information, the processing unit 12 calculates a similarity 17a based on a comparison of the partial character strings 15a and the partial character strings 15. For the job 13b indicated by the history information, the processing unit 12 calculates a similarity 17b based on a comparison of the partial character strings 15b and the partial character strings 15. The comparison of partial character strings may include calculating the number of matching partial character strings. The similarity 17a indicates the similarity between the file name 14a and the file name 14. The similarity 17b indicates the similarity between the file name 14b and the file name 14. The similarities 17a and 17b are not binary indicators indicating whether two file names perfectly match, but are multi-valued indicators indicating the degree of partial match. As one example of the indicator used to indicate the similarities 17a and 17b, the distance between the two file names is used. The smaller the indicator of distance, the greater the similarity of the two file names, and the larger the indicator of distance, the lesser the similarity of the two file names.

In accordance with the similarities 17a and 17b, the processing unit 12 acquires the actual power consumption of at least one executed job from the history information. As one example, the processing unit 12 acquires the actual power consumption of the executed job with the highest similarity. Here, assume that the actual power consumption 16a corresponding to the job 13a has been acquired. The processing unit 12 then estimates power consumption 18 of the job 13 awaiting execution based on the acquired actual power consumption 16a. As one example, the processing unit 12 regards the actual power consumption 16a as the power consumption 18 of the job 13.

With the parallel processing system according to the first embodiment, the file name 14 is extracted from a file path indicating the storage location of a file used to launch the job 13 awaiting execution. For the executed jobs 13a and 13b, the similarities 17a and 17b are calculated based on comparisons between the partial character strings 15a and 15b included in the file names 14a and 14b and the partial character strings 15 included in the file name 14. The actual power consumption of at least one job is then acquired in keeping with the similarities 17a and 17b, and the power consumption 18 is estimated based on the acquired actual power consumption.

By doing so, compared to when the power consumption 18 is estimated from only the number of used nodes, it is possible to consider the effect on the power consumption 18 of the differences in characteristics between user programs. In addition, it is possible to find past jobs where the characteristics of the user program are similar, even when the file name 14 does not completely match the file name of any past job.

Conceivable examples of this are a case where a given user repeatedly executes a job while making slight corrections to a user program and a case where a job is repeatedly executed while changing the parameter values provided to a user program. In these cases, the file names may be partially changed to distinguish between the differences in version and parameter values of the user program. It is common for file names to include a core part that does not change and a variable part indicating a serial number, a date, parameter values, and the like. It is therefore possible for file names to not completely match, even for jobs where the content of the information processing is close. By determining whether file names partially match however, it is possible to find past jobs that are similar. As a result, the estimation precision for the power consumption of jobs is improved.

Second Embodiment

Next, a second embodiment will be described.

Figure 2:
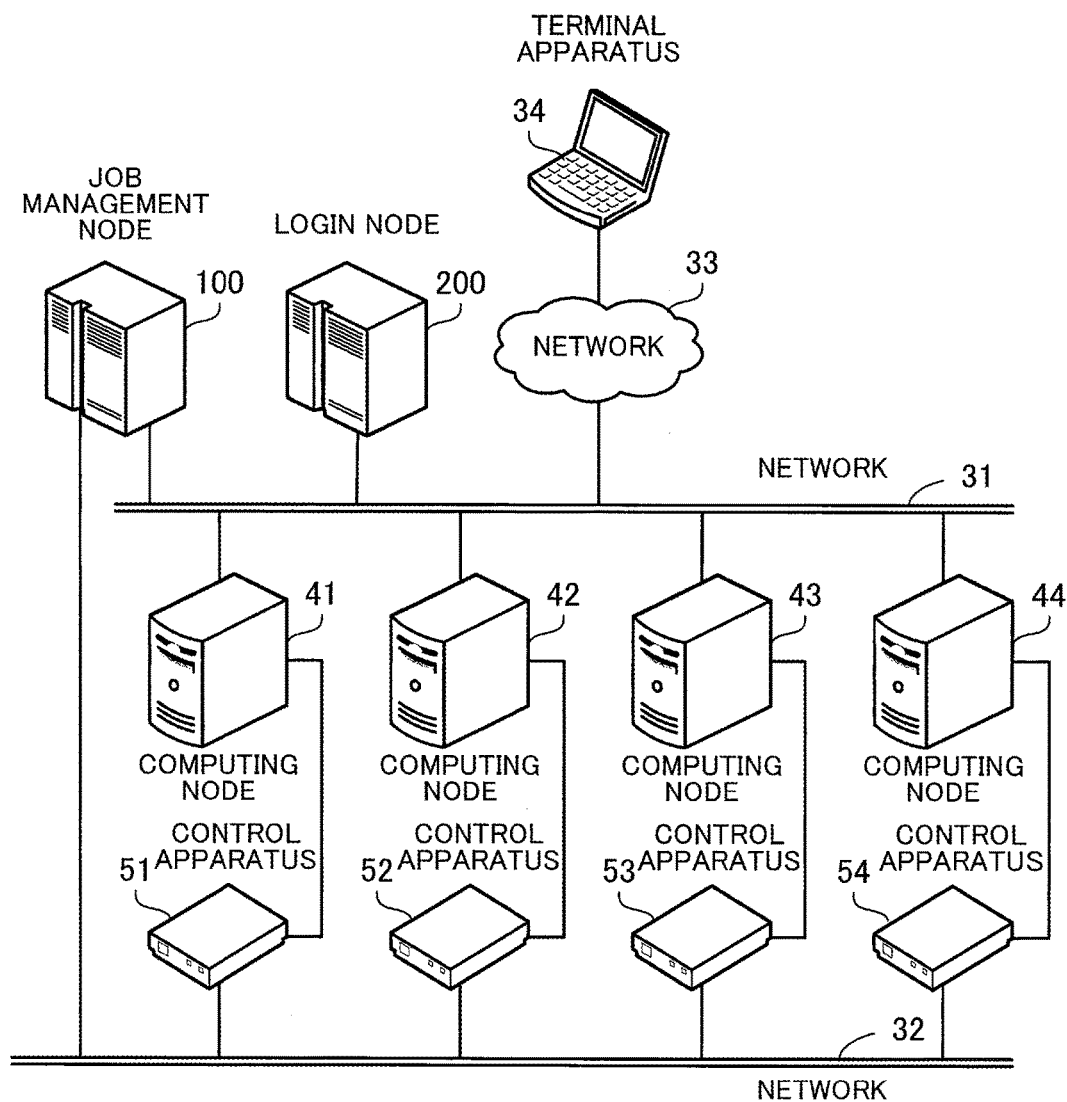
FIG. 2 depicts an example of a parallel processing system according to a second embodiment.

FIG. 2 depicts an example of a parallel processing system according to the second embodiment.

The parallel processing system according to the second embodiment includes a terminal apparatus 34, computing nodes 41 to 44, control apparatuses 51 to 54, a job management node 100, and a login node 200. The job management node 100 is one example of the parallel processing apparatus 10 according to the first embodiment.

The computing nodes 41 to 44, the job management node 100, and the login node 200 are connected to a network 31.

As one example, the network 31 is a local network used for data communication. The terminal apparatus 34 is connected to a network 33. As one example, the network 33 is a wide-area network, such as the Internet. The control apparatuses 51 to 54 and the job management node 100 are connected to a network 32. As one example, the network 32 is a local network used for management purposes. The control apparatus 51 is connected to the computing node 41, the control apparatus 52 is connected to the computing node 42, the control apparatus 53 is connected to the computing node 43, and the control apparatus 54 is connected to the computing node 44.

The terminal apparatus 34 is a client computer used by the user. The terminal apparatus 34 accesses the login node 200 via the network 33 and the network 31. The terminal apparatus 34 transmits a script file in which job information is written and/or a user program to the login node 200 and requests the login node 200 to execute a job. Execution conditions, an execution procedure, and the like of the job are written in the script file. As one example, the number of computing nodes to be used and the file name of a user program to be executed are written in the script file. However, the login node 200 may be informed of the number of computing nodes to be used from the terminal apparatus 34 separately to the script file.

The computing nodes 41 to 44 are server computers that execute user programs in parallel. During one time zone, one computing node is assigned one job at most. When a job is complete, the computing nodes that were assigned to that job are freed. As one example, user programs used to execute jobs are transmitted from the job management node 100 to the computing nodes 41 to 44. However, the computing nodes 41 to 44 may acquire a user program from the login node 200 in accordance with instructions from the job management node 100.

The control apparatuses 51 to 54 perform on/off control of the power supplies of the connected computing nodes in accordance with instructions from the job management node 100. When a launch instruction is received from the job management node 100, the control apparatuses 51 to 54 change the power supplies of the connected computing nodes from off to on. Similarly, when a stop instruction is received from the job management node 100, the control apparatuses 51 to 54 change the power supplies of the connected computing nodes from on to off. The control apparatuses 51 to 54 measure the power consumption of the connected computing nodes and regularly notify the job management node 100 via the network 32 of the measured power consumption.

That is, the control apparatus 51 manages the power supply of the computing node 41 and measures the power consumption of the computing node 41. The control apparatus 52 manages the power supply of the computing node 42 and measures the power consumption of the computing node 42. The control apparatus 53 manages the power supply of the computing node 43 and measures the power consumption of the computing node 43. The control apparatus 54 manages the power supply of the computing node 44 and measures the power consumption of the computing node 44. The power consumption measured by the control apparatuses 51 to 54 is the overall power consumption of the computing nodes that are connected and includes the power consumption of the processor, the memory, fans, and the like.

However, the power consumption measured by the control apparatuses 51 to 54 may be reported to the job management node 100 via the computing nodes 41 to 44 and the network 31. Also, instead of the control apparatuses 51 to 54 measuring the power consumption, the computing nodes 41 to 44 may measure the power consumption themselves using power measuring components incorporated in the computing nodes 41 to 44. When the computing nodes 41 to 44 measure the power consumption of each component part such as the processor and the memory, a value produced by summing the power consumption of each component part may be set as the overall power consumption of a computing node.

The job management node 100 is a server computer that performs job scheduling by assigning the computing nodes 41 to 44 to one or more jobs. A storage apparatus of the login node 200 is logically mounted on the job management node 100. That is, the job management node 100 treats a storage region of the storage apparatus of the login node 200 as (a virtual) part of the storage region managed by the job management node 100. The job management node 100 is therefore able to see script files and user programs that the user has written into the login node 200 in the file system of the job management node 100.

The job management node 100 performs job scheduling based on the number of computing nodes requested by each job awaiting execution so as to increase the utilization rate of the computing nodes 41 to 44. However, the job management node 100 performs scheduling so that the overall power consumption of the computing nodes 41 to 44 does not exceed a predetermined upper limit. At this time, for each job awaiting execution, the job management node 100 calculates an estimate of the power consumption per computing node and multiplies the power consumption per computing node by the number of computing nodes to estimate the power consumption of the job.

The job management node 100 transmits a user program stored in the login node 200 to the assigned computing nodes. Alternatively, the job management node 100 temporarily mounts a root directory or a specified subordinate directory of the login node 200 to the assigned computing nodes to enable the computing nodes 41 to 44 to acquire a user program from the login node 200. The job management node 100 transmits a command for launching the user program to the assigned computing nodes.

The login node 200 is a server computer that acts as a gateway that receives job execution requests from the user. The login node 200 stores a script file and/or a user program received from the terminal apparatus 34 in the storage apparatus of the login node 200. The login node 200 notifies the job management node 100 of job requests.

Figure 3:
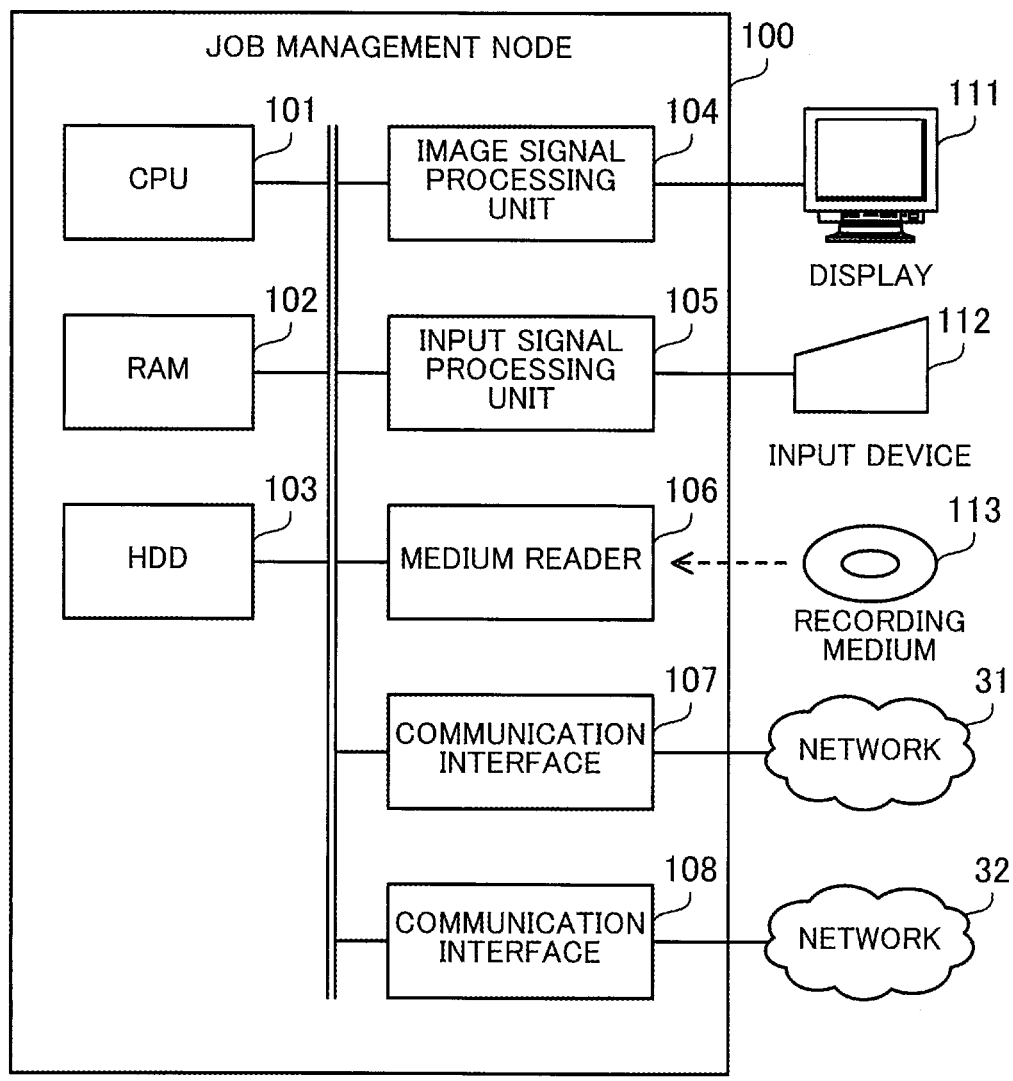
FIG. 3 is a block diagram depicting example hardware of a job management node.

FIG. 3 is a block diagram depicting example hardware of the job management node.

The job management node 100 includes a CPU 101, RAM 102, an HDD 103, an image signal processing unit 104, an input signal processing unit 105, a medium reader 106, and communication interfaces 107 and 108. The respective units are connected to a bus. The RAM 102 or the HDD 103 is one example of the storage unit 11 in the first embodiment. The CPU 101 is one example of the processing unit 12 in the first embodiment.

The CPU 101 is a processor including computation circuitry that executes instructions of a program. The CPU 101 loads at least part of a program and data stored in the HDD 103 into the RAM 102 and executes the program. Note that the CPU 101 may be equipped with a plurality of processor cores, the job management node 100 may be equipped with a plurality of processors, and the processing described below may be executed in parallel by a plurality of processors or processor cores. A group composed of a plurality of processors may be referred to in this specification as a "multiprocessor" or simply as a "processor".

The RAM 102 is a volatile semiconductor memory that temporarily stores programs to be executed by the CPU 101 and data used in computation by the CPU 101. Note that the job management node 100 may be equipped with memory of another type aside from RAM, and/or may be equipped with a plurality of memories.

The HDD 103 is a nonvolatile storage apparatus that stores an OS (Operating System), middleware, software programs such as application software, and data. The programs include a job power consumption estimating program. Note that the job management node 100 may be equipped with other types of storage apparatus, such as flash memory and an SSD (Solid State Drive) and may be equipped with a plurality of nonvolatile storage apparatuses.

The image signal processing unit 104 outputs images to a display 111 connected to the job management node 100 in accordance with instructions from the CPU 101. As the display 111, it is possible to use a CRT (Cathode Ray Tube) display, an LCD (Liquid Crystal Display), a plasma display, an organic EL (Electro-Luminescence) display, or the like.

The input signal processing unit 105 acquires an input signal from an input device 112 connected to the job management node 100 and outputs to the CPU 101. As the input device 112, it is possible to use a pointing device, such as a mouse, a touch panel, a touch pad, or a trackball, a keyboard, a remote controller, button switches, or the like. It is also possible to connect a plurality of types of input device to the job management node 100.

The medium reader 106 is a reader apparatus that reads programs and data recorded on a recording medium 113. As examples, as the recording medium 113, it is possible to use a magnetic disk, an optical disk, a magneto-optical (MO) disc, or a semiconductor memory. Examples of magnetic disks include flexible disks (FD) and HDD. Examples of optical discs include CD (Compact Disc) and DVD (Digital Versatile Disc).

As one example, the medium reader 106 copies programs and data read from the recording medium 113 into another recording medium, such as the RAM 102 or the HDD 103. The read-out program is executed by the CPU 101, for example. Note that the recording medium 113 may be a portable recording medium and may be used to distribute programs and data. The recording medium 113 and/or the HDD 103 may also be referred to as "computer-readable recording media".

The communication interface 107 is an interface that is connected to the network 31 and communicates via the network 31 with the login node 200 and the computing nodes 41 to 44. The communication interface 108 is an interface that is connected to the network 32 and communicates via the network 32 with the control apparatuses 51 to 54. As examples, the communication interfaces 107 and 108 are wired communication interfaces that are connected by cables to communication apparatuses, such as switches. However, the communication interfaces 107 and 108 may alternatively be wireless communication interfaces that are connected via wireless links to a base station.

The terminal apparatus 34, the computing nodes 41 to 44, and the login node 200 may be implemented using the same hardware as the job management node 100. However, the computing nodes 41 to 44 each have an interface that is connected to a control apparatus.

Next, job scheduling and estimation of job power consumption will be described.

Figure 4:
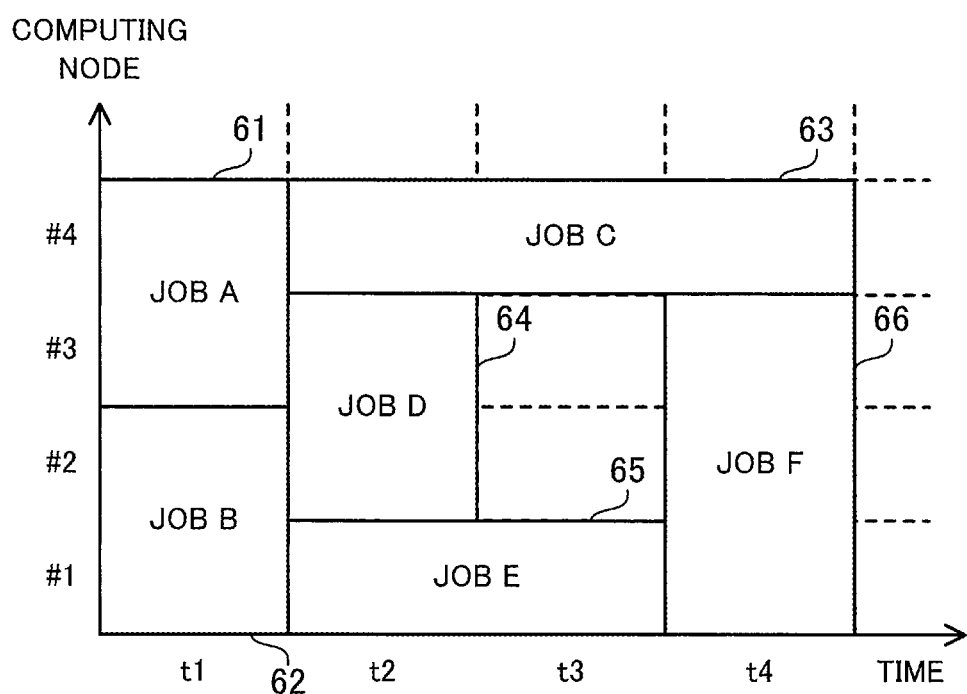
FIG. 4 depicts one example of job scheduling.

FIG. 4 depicts one example of job scheduling.

Here, consider a case where jobs 61 to 66 have been inputted from the same user or different users and the inputted jobs 61 to 66 are awaiting execution.

The job 61 (or "job A") plans to use two computing nodes for one time unit. The job 62 (or "job B") plans to use two computing nodes for one time unit. The job 63 (or "job C") plans to use one computing node for three time units. The job 64 (or "job D") plans to use two computing nodes for one time unit. The job 65 (or "job E") plans to use one computing node for two time units. The job 66 (or "job F") plans to use three computing nodes for one time unit.

Based on the above execution conditions, the job management node 100 assigns computing nodes and time zones to the jobs 61 to 66. For example, the job 61 is assigned the computing nodes 43 and 44 in time zone t1. The job 62 is assigned the computing nodes 41 and 42 in time zone t1. The job 63 is assigned the computing node 44 in time zones t2 to t4. The job 64 is assigned the computing nodes 42 and 43 in time zone t2. The job 65 is assigned the computing node 41 in time zones t2 and t3. The job 66 is assigned the computing nodes 41 to 43 in time zone t4. To increase the throughput of the parallel processing system, it is preferable to schedule jobs so as to minimize the number of unused nodes.

However, there is a condition that in each of time zones t1 to t4, the total power consumption of the computing nodes 41 to 44 does not exceed the predetermined upper limit. For time zone t1, the condition is that the total power consumption of the jobs 61 and 62 does not exceed the upper limit. For time zone t2, the condition is that the total power consumption of the jobs 63, 64, and 65 does not exceed the upper limit. For time zone t3, the condition is that the total power consumption of the jobs 63 and 65 does not exceed the upper limit. For time zone t4, the condition is that the total power consumption of the jobs 63 and 66 does not exceed the upper limit.

The job management node 100 estimates the power consumption per computing node for each of the jobs 61 to 66 from the actual values of the power consumption per computing node of similar past jobs. The power consumption of the jobs 61 to 66 is calculated by multiplying the power consumption per computing node by the number of computing nodes. In the second embodiment, similar past jobs are assumed to be past jobs with similar file names. As the file name, a job script name that does not include a directory name or a name that is a combination of a job script name and a directory name on the immediately higher level is used. As an indicator of similarity, an indicator that reflects a partial match of character strings is used.

Figure 5:
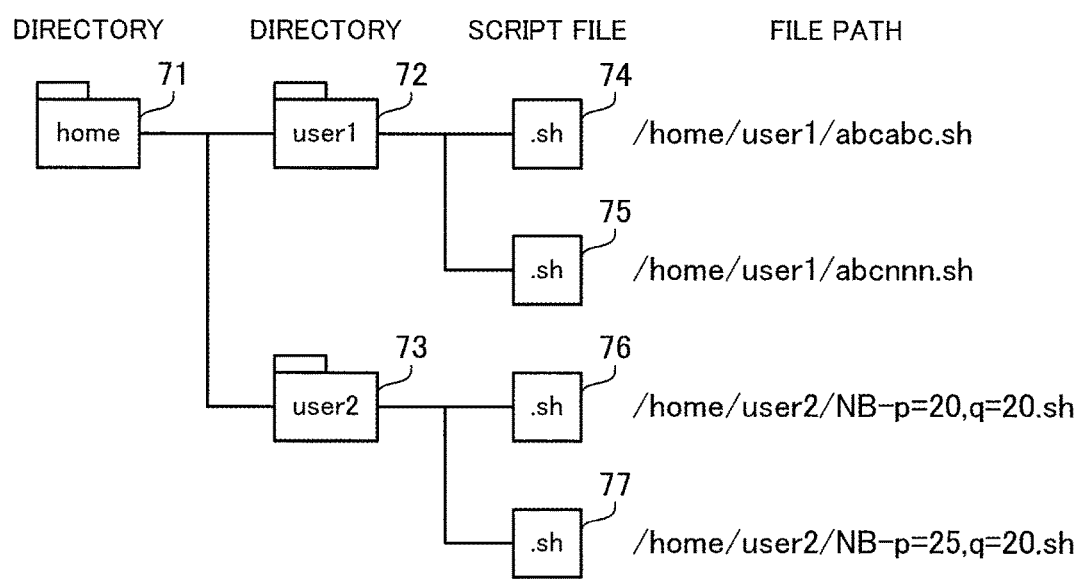
FIG. 5 depicts one example of a directory structure of a file system.

FIG. 5 depicts one example of the directory structure of a file system.

The login node 200 manages script files using a hierarchical file system. A directory 71 is a directory that is immediately below the root directory. The directory name of the directory 71 is "home". Directories 72 and 73 are directories that are immediately below the directory 71. The directory name of the directory 72 is "user1", and the directory name of the directory 73 is "user2".

Script files 74 and 75 are stored immediately below the directory 72. The script file name of the script file 74 is "abcabc.sh", and the script file name of the script file 75 is "abcnnn.sh". Script files 76 and 77 are stored immediately below the directory 73. The script file name of the script file 76 is "NB-p=20,q=20.sh", and the script file name of the script file 77 is "NB-p=25,q=20.sh".

The file path of the script file 74 is "/home/user1/abcabc.sh". The file path of the script file 75 is "/home/user1/abcnnn.sh". The file path of the script file 76 is "/home/user2/NB-p=20,q=20.sh". The file path of the script file 77 is "/home/user2/NB-p=25,q=20.sh".

Here, the directory structure and directory names of the file system are set in accordance with a system operation policy set by the manager of the parallel processing system. However, a directory that is immediately above script files will often use a name that identifies a user, such as a login account name, a research group name, or an organization name. In many cases, the user of the terminal apparatus 34 will store script files directly below the directory that has been assigned to him or her. As one example, the script files 74 and 75 are script files that were generated by the user "user1" and the script files 76 and 77 are script files that were generated by the user "user2".

A user that has inputted a plurality of jobs with a similar information processing content will often use script file names that include a core part that does not change and a variable part that changes for each job. As the variable part, a serial number decided by the user, a date when a job is executed, parameter values provided to a user program, and the like are used. As one example, out of the script file name of the script file 76, "NB" is the core part and "p=20,q=20" is the variable part. Similarly, out of the script file name of the script file 77, "NB" is the core part and "p=25,q=20" is the variable part.

Here, the job management node 100 uses file names to determine the similarity between jobs. The used file names are script file names that do not include a directory name or combinations of a script file name and a directory name of the directory immediately above the script file.

Accordingly, "abcabc.sh" or "user1/abcabc.sh" is used for a job that uses the script file 74. Similarly, "abcnnn.sh" or "user1/abcnnn.sh" is used for a job that uses the script file 75, "NB-q=20,q=20.sh" or "user2/NB-q=20,q=20.sh" is used for a job that uses the script file 76, and "NB-q=25,q=20.sh" or "user2/NB-q=25,q=20.sh" is used for a job that uses the script file 77.

The job management node 100 calculates the "distance" between two file names with consideration to a partial match between the two file names. The job management node 100 determines that two file names for which the distance is below a threshold are similar. In the second embodiment, the distance between two file names is calculated using a set of trigrams (3-grams). A trigram is three consecutive characters included in a file name. However, it is assumed that two blank characters (spaces) are present before and after the file name. Accordingly, m+2 trigrams are extracted from an m-character file name.

Note that in place of trigrams, it is also possible to use a bigram (2-gram), a four-gram, a five-gram, or the like. When an n-gram is used, it is assumed that n−1 blanks are present before and after the file name. When the directory name of the directory immediately above is included in the file name, it is possible to generate an "n-gram" by including directory separators such as "/" or to generate an "n-gram" by excluding the directory separators.

FIG. 6 depicts an example of a power consumption history table.

The job management node 100 stores a power consumption history table 121. The power consumption history table 121 has "File Name", "Trigrams", and "Power Consumption" columns.

In the "File Name" column, a script file name that does not include a directory name or a combination of a directory name of a directory immediately above a script file and a script file name is registered for each script file used for a job executed in the past. In FIG. 6, a case where the file names are script file names that do not include directory names is imagined.

Sets of trigrams extracted from a file name are registered in the "Trigrams" column. More specifically, pairs of a type of trigram (or "key") and the number of that type are given for all of the keys. To facilitate searches, keys are sorted into ascending order. As one example, one "__a", one "_ab", one ".sh", two "abc", one "bc.", one "bca", one "c.s", one "cab", one "h__", and one "sh_" are extracted from "abcabc.sh". In a trigram, "_" represents a space Note that since it is possible to generate trigrams from a file name, it is possible to register only one of file names and trigrams in the power consumption history table 121.

Actual values of power consumption measured during execution of a job are registered in the "Power Consumption" column. When power consumption is measured a plurality of times during the execution of one job, the power consumption registered in the power consumption history table 121 is the mean of the plurality of measurements of power consumption. Also, when a plurality of computing nodes are used by one job, the power consumption registered in the power consumption history table 121 is the mean power consumption per computing node. Likewise, when a job with the same file name is executed a plurality of times, the power consumption registered in the power consumption history table 121 is the mean power consumption produced by averaging the power consumption of a plurality of executions of the job. As one example, the power consumption "120 W" is registered for the file name "abcabc.sh".

Figure 7:
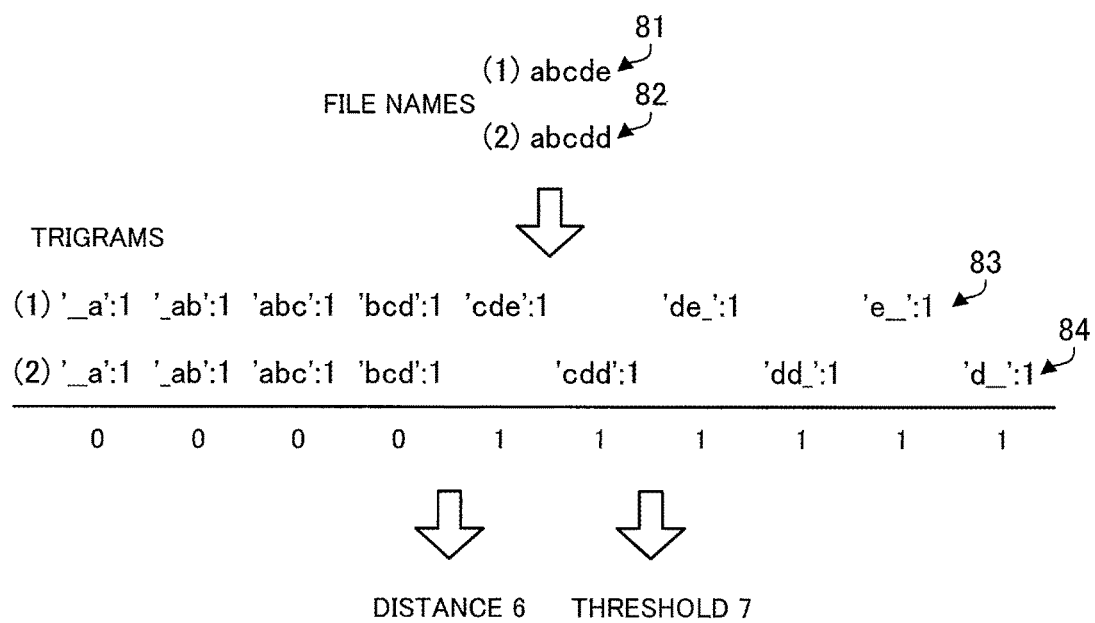
FIG. 7 depicts an example of how similarity between file names is determined.

FIG. 7 depicts an example of how similarity between file names is determined.

Here, consider a case where it is determined whether the file name 81 and the file name 82 are similar. The file name 81 is "abcde" and the file name 82 is "abcdd". A trigram set 83 is generated from the file name 81. A trigram set 84 is generated from the file name 82. The trigram set 83 includes the keys "__a", "_ab", "abc", "bcd", "cde", "de_", and "e__". Each of these keys appears once. The trigram set 84 includes the keys "__a", "_ab", "abc", "bcd", "cdd", "dd_", and "d__". Each of these keys appears once.

The job management node 100 compares the trigram set 83 with the trigram set 84 and calculates the distance between the file name 81 and the file name 82. More specifically, the job management node 100 finds an absolute value of the differences in the number of appearances for the same keys and sets the total of the absolute value of the differences as the distance. Although the number of appearances in the trigram sets 83 and 84 is the same for "__a", "_ab", "abc", and "bcd", the number of appearances for "cde", "cdd", "de_", "dd_", "e__", and "d__" each differ by one. Accordingly, the distance between the file name 81 and the file name 82 is calculated as "6".

The job management node 100 also decides a threshold based on the trigram sets of jobs awaiting execution. More specifically, the job management node 100 sets the number of keys included in the trigram sets awaiting execution as the threshold. Here, assume that the file name 81 is the file name of a job awaiting execution and the file name 82 is the file name of a past job. In this case, "7", which is the number of keys included in the trigram set 83, is set as the threshold. The job management node 100 determines that two file names are similar when the distance is smaller than the threshold. Accordingly, it is determined that the file name 81 and the file name 82 are similar.

In the example above, the n-gram set extracted from each file name is used to calculate the distance between two file names. On the other hand, it is also possible to calculate the distance between two file names according to another method. As one example, it is also possible to use the Levenshtein distance (edit distance) as an indicator of distance. The Levenshtein distance is the minimum number of character edits when transforming one character string to another character string. Here, a "character edit" refers to the insertion of one character, the deletion of one character, or the replacement of one character. As one example, the character string "ad" is transformed to the character string "abc" by replacing "d" with "b" and inserting "c". Accordingly, the distance between "ad" and "abc" is "2". The Levenshtein distance is calculated by dynamic programming, for example.

Next, the functions and processing procedure of the parallel processing system will be described.

Figure 8:
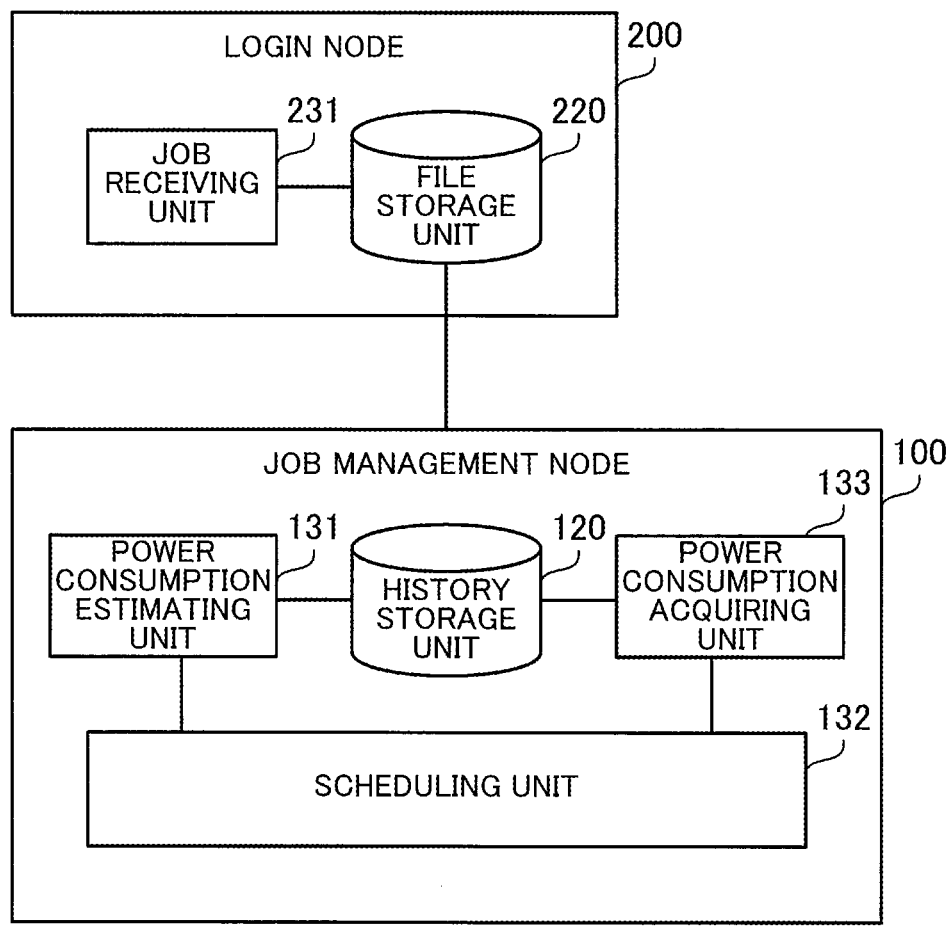
FIG. 8 is a block diagram depicting example functions of a login node and a job management node.

FIG. 8 is a block diagram depicting example functions of the login node and the job management node.

The login node 200 includes a file storage unit 220 and a job receiving unit 231. The file storage unit 220 is implemented using a storage region reserved in an HDD, for example. The job receiving unit 231 is implemented using a program module, for example.

The file storage unit 220 stores files that are managed by a hierarchical directory structure. The files include script files and user programs. The file storage unit 220 is accessed from the job management node 100. The job receiving unit 231 receives script files and/or user programs from the terminal apparatus 34. The job receiving unit 231 stores the received script files and/or user programs in the file storage unit 220. The login node 200 receives execution requests for jobs from the terminal apparatus 34. The login node 200 notifies the job management node 100 of the execution requests for jobs.

The job management node 100 includes a history storage unit 120, a power consumption estimating unit 131, a scheduling unit 132, and a power consumption acquiring unit 133. As one example, the history storage unit 120 is implemented using a storage region reserved in the RAM 102 or the HDD 103. The power consumption estimating unit 131, the scheduling unit 132, and the power consumption acquiring unit 133 are implemented using program modules executed by the CPU 101.

The history storage unit 120 stores the power consumption history table 121. The power consumption estimating unit 131 refers to the power consumption history table 121 to estimate the power consumption per computing node for jobs awaiting execution that have been reported from the login node 200. When doing so, the power consumption estimating unit 131 compares the file name of a job awaiting execution with the respective file names of past jobs to calculate the distance between two file names and uses the actual power consumption of the job with the shortest distance as the estimated power consumption. However, when there is no job for which the distance is shorter than the threshold, the power consumption estimating unit 131 sets the estimated power consumption at a default value decided in advance. The power consumption estimating unit 131 notifies the scheduling unit 132 of the estimated power consumption.

The scheduling unit 132 acquires the estimated power consumption from the power consumption estimating unit 131 and performs job scheduling based on the estimated power consumption and number of used nodes of each job awaiting execution. During job scheduling, one or more computing nodes is assigned to each job awaiting execution so as to minimize the number of unused computing nodes (i.e., so as to increase the utilization ratio of the computing nodes 41 to 44), with the condition that the total power consumption in each time zone does not exceed the predetermined upper limit. The scheduling unit 132 instructs the computing nodes 41 to 44 to execute user programs based on the decided job schedule.

On detecting that the execution of a given job has been completed, the scheduling unit 132 notifies the power consumption acquiring unit 133 of the end of the job. As one example, the completion of execution of a job is detected by receiving notification of the end of a user program from every computing node to which the job has been assigned. Notification of the end of a job is given for example by indicating the file name of the script file used to execute the job.

The power consumption acquiring unit 133 acquires information on the power consumption of the computing nodes 41 to 44 from the control apparatuses 51 to 54. However, the power consumption acquiring unit 133 may acquire information on the power consumption from the computing nodes 41 to 44 themselves. The information on the power consumption may be regularly acquired or may be acquired once or multiple times during the execution period of a job from the computing nodes to which the job has been assigned. Also, information on power consumption that has been measured a plurality of times may be accumulated in the computing nodes 41 to 44 and the accumulated information may be collectively acquired by the power consumption acquiring unit 133 when the job has ended.

On being notified of the end of a job by the scheduling unit 132, the power consumption acquiring unit 133 updates the power consumption history table 121. When doing so, the power consumption acquiring unit 133 specifies one or more computing nodes that were used by the job that has ended and calculates the power consumption to be registered in the power consumption history table 121 based on the information on the power consumption of the specified computing nodes. The power consumption acquiring unit 133 also generates a trigram set from the file name of the job that has ended.

As examples, the power consumption to be registered in the power consumption history table 121 is the mean power consumption calculated by averaging power consumption measured at different timing and/or by averaging power consumption measured for a plurality of computing nodes. When a file name that is the same as the file name of the ended job is not present in the power consumption history table 121, the power consumption acquiring unit 133 may add a record including the file name, trigrams, and power consumption to the power consumption history table 121. On the other hand, when a file name that is the same as the file name of the ended job is present in the power consumption history table 121, the power consumption acquiring unit 133 calculates the mean power consumption (which is a moving average, weighted average, or the like) of a plurality of executions of the job and updates the entry in the power consumption column.

Figure 9:
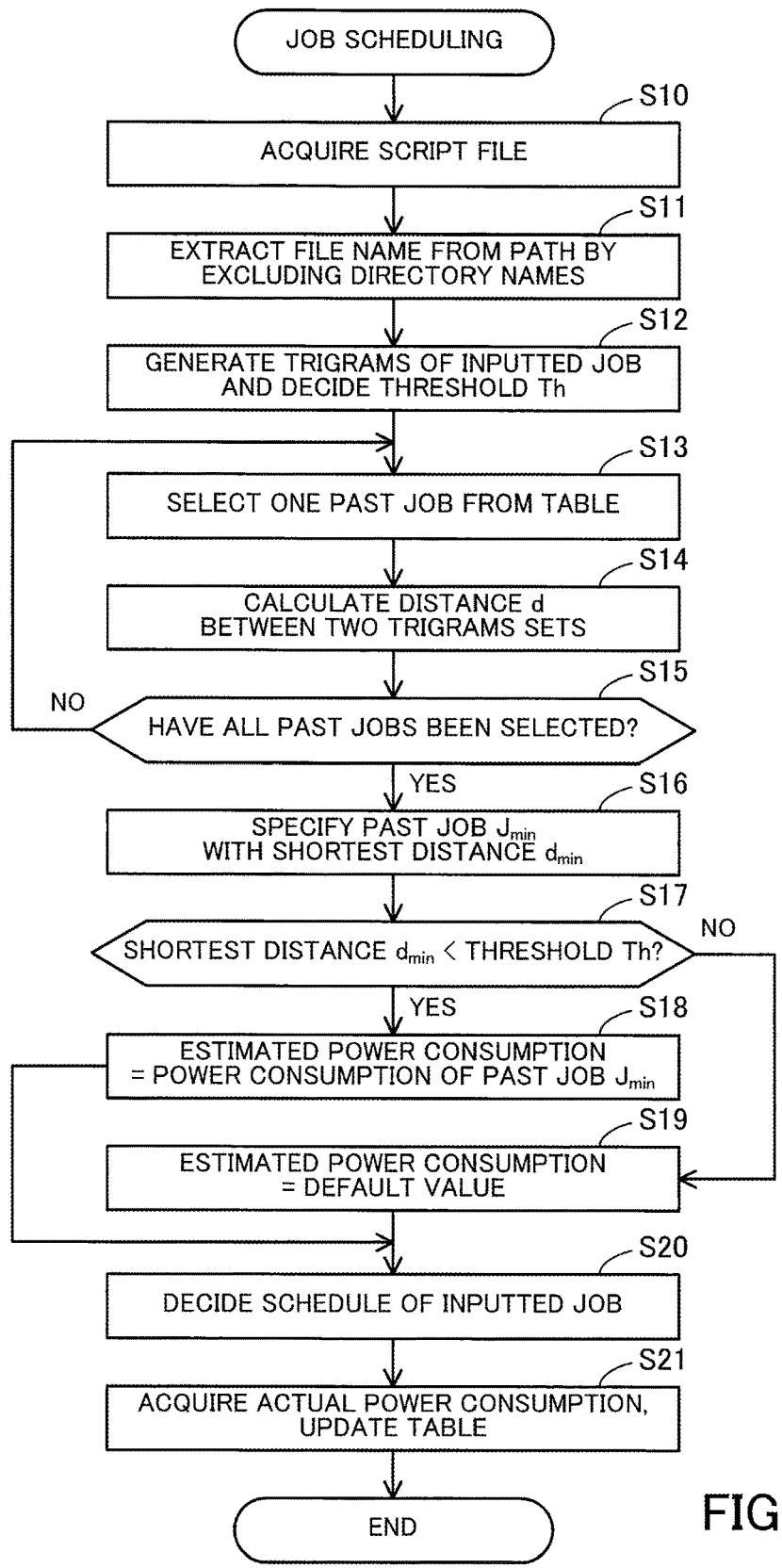
FIG. 9 is a flowchart depicting an example procedure of job scheduling.

FIG. 9 is a flowchart depicting an example procedure of job scheduling.

(S10) The power consumption estimating unit 131 acquires a script file from the file storage unit 220 that has been mounted so that the file storage unit 220 is visible from the job management node 100.

(S11) The power consumption estimating unit 131 specifies an absolute path from the root directory as a file path indicating the location in the file system at which the script file acquired in step S10 is stored. The power consumption estimating unit 131 extracts a file name produced by excluding directory names from the file path. As one example, the power consumption estimating unit 131 searches for directory separators (such as "/") from the end of the file path toward the front and sets a range from the character following the first directory separator to be found to the end as the file name.

However, the power consumption estimating unit 131 may extract the file name from the file path so that the file name includes only the directory name of the directory immediately above the script file out of the directory names. As one example, the power consumption estimating unit 131 may search for directory separators from the end toward the front of the file path and set a range from the character following the second directory separator to be found to the end as the file name.

(S12) The power consumption estimating unit 131 generates a trigram set, which is a set of three consecutive characters, from the file name extracted in step S11. It is possible to extract m+2 trigrams from an m-character file name. The power consumption estimating unit 131 also sets the number of keys (the number of types of trigram without duplicates) included in the trigram set generated here as the threshold Th.

(S13) The power consumption estimating unit 131 selects one past job from the past jobs registered in the power consumption history table 121.

(S14) The power consumption estimating unit 131 acquires the trigram set of the past job selected in step S13 from the power consumption history table 121. The power consumption estimating unit 131 compares the trigram set in step S12 (i.e., the trigram set of an inputted job) with the trigram set acquired here (i.e., the trigram set of a past job). The power consumption estimating unit 131 then calculates the distance d between the two file names. The smaller the distance d, the more similar the two file names, and the larger the distance d, the less similar the two file names. As one example, the power consumption estimating unit 131 finds the absolute values of the differences in the number of appearances of each of a plurality of keys and sets a value produced by summing the absolute values of the found differences as the distance d.

(S15) The power consumption estimating unit 131 determines whether all of the past jobs registered in the power consumption history table 121 have been selected. When all of the past jobs have been selected, the processing proceeds to step S16, while when there is an unselected past job, the processing proceeds to step S13.

(S16) The power consumption estimating unit 131 specifies a minimum value of the distances d calculated in step S14 as the minimum distance $d_{min}$. The power consumption estimating unit 131 also specifies the past job for which the minimum distance $d_{min}$ was calculated as the past job $J_{min}$.

(S17) The power consumption estimating unit 131 compares the minimum distance $d_{min}$ specified in step S16 with the threshold Th decided in step S12 and determines whether the minimum distance $d_{min}$ is below the threshold Th ($d_{min}$<Th). When the minimum distance $d_{min}$ is below the threshold Th, the processing proceeds to step S18, while when the minimum distance $d_{min}$ is equal to or above the threshold Th, the processing proceeds to step S19.

(S18) The power consumption estimating unit 131 determines whether the file name of the past job $J_{min}$ is sufficiently similar to the file name of the inputted job. When this is the case, the power consumption estimating unit 131 acquires the power consumption of the past job $J_{min}$ from the power consumption history table 121. The power consumption estimating unit 131 estimates that the power consumption per computing node of the inputted job is equal to the power consumption of the past job $J_{min}$. The processing then proceeds to step S20.

(S19) The power consumption estimating unit 131 determines that there is no past job whose file name is sufficiently similar to the inputted job. The power consumption estimating unit 131 then estimates that the power consumption per computing node of the inputted job is a predetermined default value (for example, 100 W).

(S20) The scheduling unit 132 decides the schedule of the inputted job based on the power consumption estimated in step S18 or step S19. When doing so, the scheduling unit 132 decides the computing nodes to be assigned to the inputted job and the execution start time so that the total power consumption in each time zone does not exceed the predetermined upper value.

(S21) The power consumption acquiring unit 133 acquires the actual power consumption from the control apparatuses 51 to 54. When the execution of the inputted job described above ends, the power consumption acquiring unit 133 calculates the mean power consumption per computing node used by the inputted job from the measured actual power consumption. The power consumption acquiring unit 133 also generates a trigram set from the file name of the inputted job. However, the power consumption acquiring unit 133 may acquire the trigrams in step S12 from the power consumption estimating unit 131. The power consumption acquiring unit 133 uses the trigram set and the mean power consumption to update the power consumption history table 121.

With the parallel processing system according to the second embodiment, the distance between the file name of a script file used by a job awaiting execution and file names of the script files used by past jobs is calculated and reference is made to the actual power consumption of a past job for which the distance is small. Accordingly, it is possible to consider the influence that differences in the characteristics of user programs have on the power consumption of jobs awaiting execution and to thereby improve the estimation precision of the power consumption of jobs awaiting execution.

Also, even when two file names do not completely match, the distance between two file names is calculated based on a partial match. Accordingly, even when the file name of a job awaiting execution is a new file name that has not been used in the past in the parallel processing system, it is still possible to estimate the power consumption. As one example, it is possible to evaluate the similarity between a job awaiting execution and past jobs based on the extent to which an invariable part, which excludes variable parts such as serial numbers, dates, and parameter values, matches. By using a distance based on trigrams or a Levenshtein distance as the distance between two file names, it is possible to calculate the distance without using a dictionary.

By including a directory name on a level immediately above the script file in the file name, it is possible to distinguish between jobs even when different users and different groups have coincidently assigned similar file names to their own script files.

According to the above embodiments, it is possible to improve the estimation precision of the power consumption of jobs.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A non-transitory computer-readable storage medium storing a computer program, the computer program that causes a computer to perform a procedure comprising:
    extracting a first file name, which is part of a file path indicating a storage location of a first file used when launching a first job, from the file path;
    calculating, for each of a plurality of second jobs that have been executed by using respective second files, similarity based on a comparison between partial character strings included in the first file name and partial character strings included in a second file name of a corresponding one of the second files; and
    acquiring, from history information indicating an actual power consumption of each second job in the plurality of second jobs and in accordance with the calculated similarity, the actual power consumption of at least one second job and estimating power consumption of the first job based on the acquired actual power consumption.

2. The non-transitory computer-readable storage medium according to claim 1, wherein the first file name includes a first directory name indicating a directory on a level immediately above the first file and the second name includes a second directory name indicating a directory on a level immediately above the corresponding one of the second files.

3. The non-transitory computer-readable storage medium according to claim 1, wherein the calculating of the similarity includes comparing a set of n consecutive characters included in the first file name with a set of n consecutive characters included in the second file name, where n is an integer of 2 or higher.

4. A parallel processing apparatus comprising:
    a memory that stores history information indicating, for each of a plurality of second jobs that have been executed by using respective second files, a second file name of a corresponding one of the second files and actual power consumption of the second job corresponding to the second file name; and
    a processor that extracts a first file name, which is part of a file path indicating a storage location of a first file used when launching a first job, from the file path, calculates, for each of the plurality of second jobs, similarity based on a comparison between partial character strings included in the first file name and partial character strings included in the second file name, acquires the actual power consumption of at least one second job from the history information in accordance with the calculated similarity, and estimates power consumption of the first job based on the acquired actual power consumption.

5. A method of estimating power consumption of a job, the method comprising:
    extracting, by a processor, a first file name, which is part of a file path indicating a storage location of a first file used when launching a first job, from the file path;
    calculating, by the processor and for each of a plurality of second jobs that have been executed by using respective second files, similarity based on a comparison between partial character strings included in the first file name and partial character strings included in a second file name of a corresponding one of the second files; and acquiring, by the processor, in accordance with the calculated similarity, and from history information indicating an actual power consumption of each second job in the plurality of second jobs, the actual power consumption of at least one second job and estimating, by the processor, power consumption of the first job based on the acquired actual power consumption.

\* \* \* \* \*